(12) United States Patent
Blosse et al.

(10) Patent No.: US 6,620,715 B1
(45) Date of Patent: Sep. 16, 2003

(54) METHOD FOR FORMING SUB-CRITICAL DIMENSION STRUCTURES IN AN INTEGRATED CIRCUIT

(75) Inventors: Alain P. Blosse, Belmont, CA (US); Saurabh Dutta Chowdhury, Belmont, CA (US)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 10/112,782

(22) Filed: Mar. 29, 2002

(51) Int. Cl.[7] ............... H01L 21/3205; H01L 21/4763; H01L 21/31; H01L 21/469
(52) U.S. Cl. ................. 438/585; 438/592; 438/738
(58) Field of Search ................. 438/585, 592, 438/738, 710, 717, 723

(56) References Cited

U.S. PATENT DOCUMENTS

| | | |
|---|---|---|
| 4,487,652 A | 12/1984 | Almgren |
| 5,045,439 A | 9/1991 | Maner et al. |
| 5,750,441 A | 5/1998 | Figura et al. |
| 5,776,638 A | 7/1998 | Park et al. |
| 5,837,615 A | 11/1998 | Rostoker |
| 5,893,757 A | 4/1999 | Su et al. |
| 6,004,654 A | 12/1999 | Shinjo et al. |
| 6,013,582 A * | 1/2000 | Ionov et al. ............... 438/738 |
| 6,052,397 A | 4/2000 | Jeon et al. |
| 6,103,596 A | 8/2000 | Peng |
| 6,171,951 B1 | 1/2001 | Lee et al. |
| 6,177,331 B1 | 1/2001 | Koga |
| 6,204,191 B1 | 3/2001 | Jung et al. |
| 6,249,035 B1 | 6/2001 | Peidous et al. |
| 6,283,131 B1 * | 9/2001 | Chen et al. ............... 438/725 |
| 6,451,647 B1 * | 9/2002 | Yang et al. ............... 438/240 |
| 6,455,333 B1 * | 9/2002 | Khathuria ............... 438/725 |
| 6,482,726 B1 * | 11/2002 | Aminpur et al. ............ 438/585 |

* cited by examiner

*Primary Examiner*—John F. Niebling
*Assistant Examiner*—Walter L. Lindsay, Jr.
(74) *Attorney, Agent, or Firm*—Kevin L. Daffer; Conley Rose P.C.

(57) ABSTRACT

A method is provided for fabricating a device, which includes device components and spacings that may each have a final dimension that is smaller than a minimum dimension obtainable by a photolithography process used to form the device components. In particular, the method may include patterning an upper layer of the semiconductor topography using the photolithography process to form a device mask having dimensions substantially equal to or greater than the minimum dimension. The method may further include trimming the device mask and forming a semiconductor structure in alignment with the trimmed device mask. In addition, the method may include patterning the semiconductor structure to form device components and spacings therebetween. In general, patterning the semiconductor structure may include tapering a first layer of the semiconductor structure and removing an exposed portion of a second layer of the semiconductor structure.

20 Claims, 10 Drawing Sheets

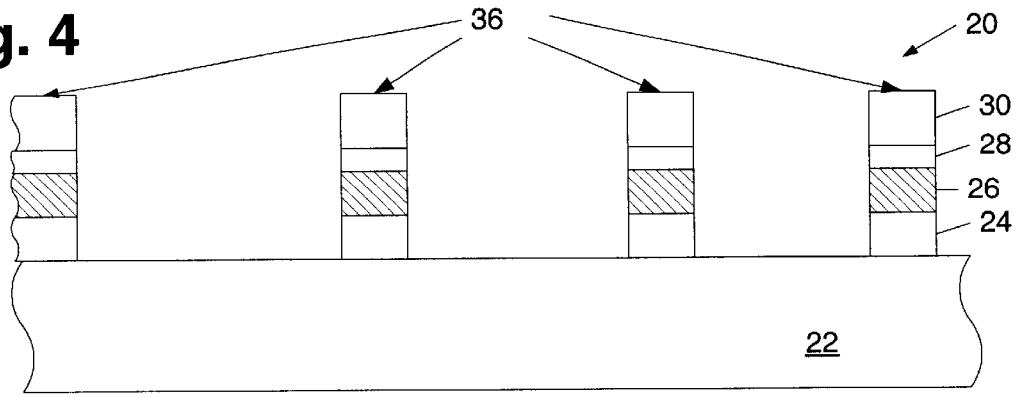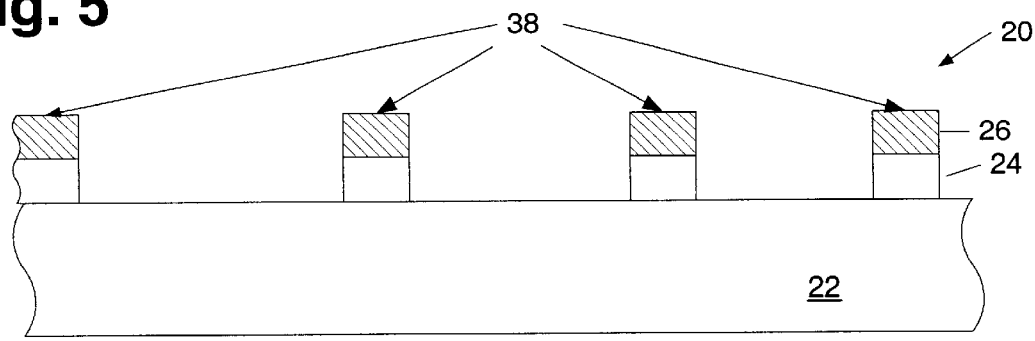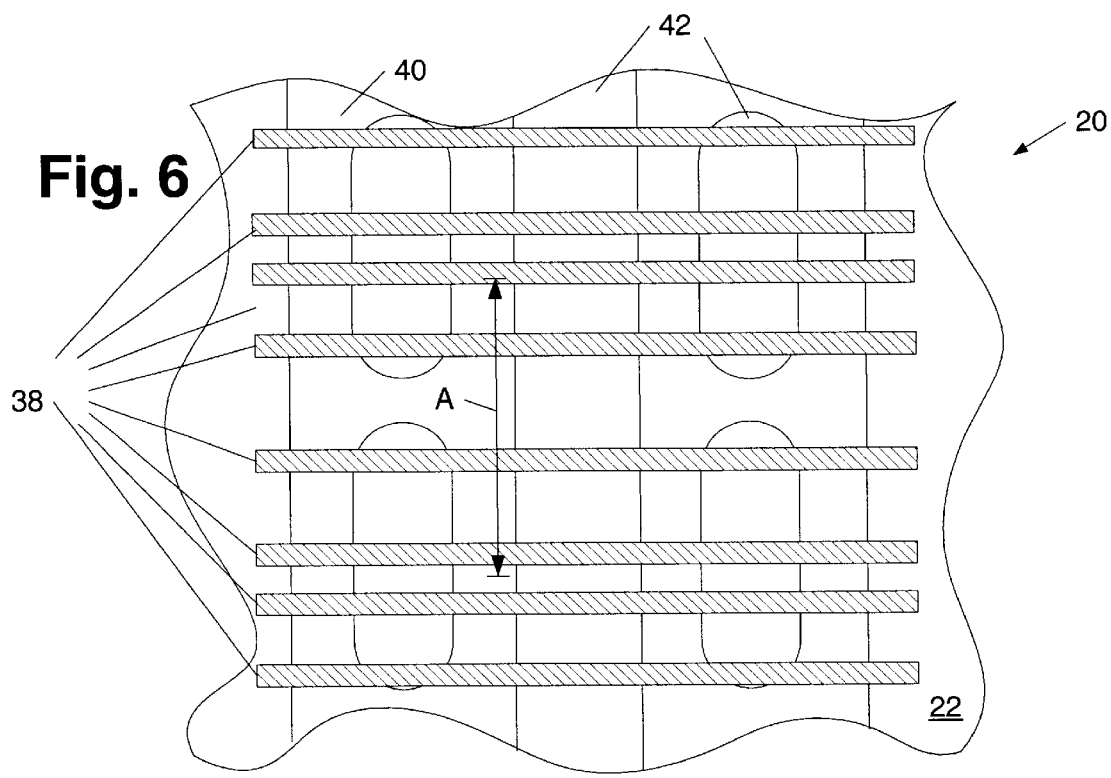

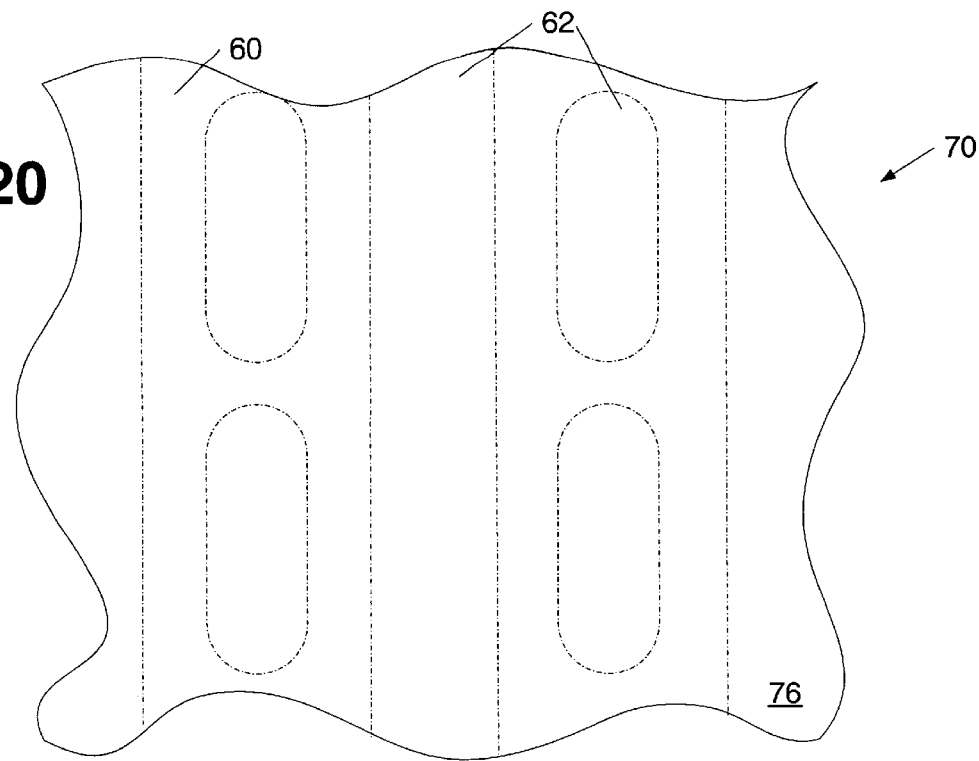
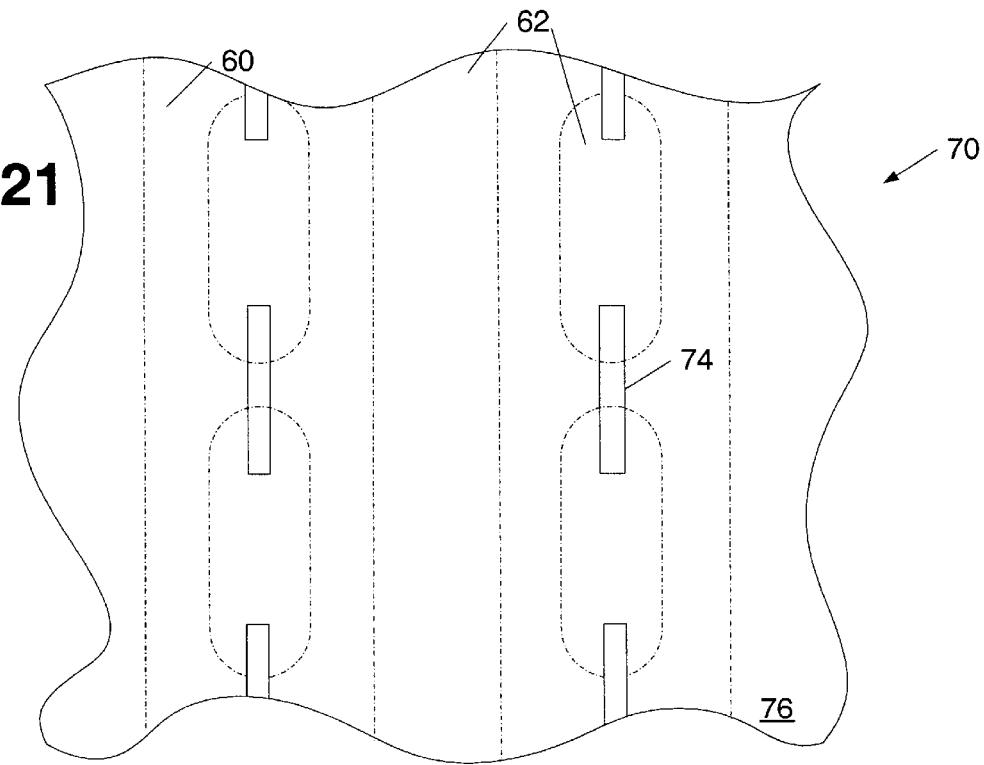

METHOD FOR FORMING SUB-CRITICAL DIMENSION STRUCTURES IN AN INTEGRATED CIRCUIT

BACKGROUND OF THE INVENTION

1. Field of the Invention

This invention relates to semiconductor device manufacturing, and more particularly, to an improved method for processing a semiconductor substrate.

2. Description of the Related Art

The following descriptions and examples are not admitted to be prior art by virtue of their inclusion within this section.

Fabrication of an integrated circuit involves numerous processing steps. To form a metal-oxide-semiconductor (MOS) integrated circuit, for example, a gate dielectric, typically formed from silicon dioxide ("oxide"), is formed on a semiconductor substrate which is doped with either n-type or p-type impurities. For each MOS field effect transistor (MOSFET) being formed, a gate conductor is formed over the gate dielectric, and dopant impurities are introduced into the substrate to form source and drain regions. Such transistors may be connected to each other and to terminals of the completed integrated circuit using conductive interconnect lines. In addition, the fabrication of MOS transistors typically includes the formation of isolation structures between the active areas of the substrate. In general, the isolation structures may define the field regions of the semiconductor substrate, while the area including transistors may define the active areas of the substrate.

A technique known as "photolithography" is generally used to pattern various structures of an integrated circuit during its fabrication process. In general, photolithography entails transferring an optical image to a photosensitive film from a patterned mask plate (i.e., reticle) placed between the light source and the film. Such a process may include coating the photosensitive film, i.e., "photoresist" upon a semiconductor topography to be patterned. A mask plate having both opaque and transparent regions may be placed above the photoresist and radiation may be transmitted through the transparent regions of the mask plate to the photoresist. The solubility of resist exposed to the radiation is altered by a photochemical reaction. Subsequently, a solvent may be used to remove the resist areas of higher solubility. The resulting patterned resist film may serve to protect underlying conductive or dielectric material from etching processes or ion implantation. Consequently, structures of an integrated circuit may be formed having a similar lateral layout to the pattern of the overlying photoresist. In some embodiments, an anti-reflective layer may be interposed between the photoresist and the semiconductor topography in order to prevent the reflection of energy rays. Such a reflection of rays may undesirably alter the pattern of the photoresist by exposing additional portions of the photoresist. In addition or alternatively, the reflected energy rays may produce standing waves within the photoresist during exposure and result in an undesirably ragged post-develop photoresist profile.

A pervasive trend in modern integrated circuit manufacture is to produce transistors having feature sizes as small as possible. Smaller feature sizes may allow more transistors to be placed on a single substrate. In addition, transistors with smaller feature sizes may function faster and at a lower threshold voltage than transistors having larger feature sizes. The feature sizes of a transistor, however, may be limited by the image resolution of the photolithographic equipment used to form the transistor. Such image resolution is typically dependent on the wavelength of the photolithographic tool. For example, the minimum resolvable feature size of a 248 nm photolithographic tool may be approximately 0.14 microns. As such, in order to obtain a structure with a feature size with a dimension smaller then approximately 0.14 microns, a smaller wavelength photolithographic tool may need to be used.

However, there are disadvantages with using smaller wavelength photolithographic tools. For example, photolithographic tools are typically expensive and therefore, purchasing new photolithographic tools for each new development of transistors with reduced feature sizes may be cost prohibitive. Furthermore, smaller wavelength photolithographic tools used to produce such transistors may require substantial process development to produce such small feature sizes. In addition, the materials used for photoresist films and underlying anti-reflective layers may be dependent on the wavelength used with the photolithographic tool and therefore, may need to be revised for consistency with the new photolithographic tools. In some cases, problems, such as poor image resolution, poor etch selectivity, or patterning clarity such as line edge roughness, may arise with such immature technologies and chemistries. As a result, the installation of new photolithographic equipment and its associated chemistry may delay the development of transistors of reduced feature sizes.

One method of producing transistor structures with dimensions smaller than the dimensions obtainable by a photolithographic tool used to pattern the structure is sometimes referred to as "trimming." "Trimming" typically includes etching the periphery of a patterned structure underlying a photoresist layer such that dimensions of the structure are reduced. Such a technique typically reduces the length and width of the patterned structure. However, a reduction in both the length and the width may be undesirable in some cases. For example, during the fabrication of gate structures, it may be desirable to reduce the width of a gate structure in order to decrease the channel length of the subsequently formed transistor. However, each end of the gate structure typically needs to extend partially over an isolation region in order to prevent a short from occurring between the gate's source and drain regions. Unfortunately, "trimming" may undesirably shorten the length of the gate structure such that one or more of its ends no longer extends over an isolation region. As a result, the subsequently formed transistor may have decreased performance or in some cases may fail to function. In some cases, the transistor fabrication process may require forming larger isolation regions to separate active areas of the transistor in order to insure that the ends of the subsequently trimmed gate structure extend over isolation regions. Such an embodiment may undesirably reduce the active area of the wafer. Consequently, fewer transistors may be fabricated on a single wafer, thereby reducing the advantage of reducing the feature size of the transistor.

It would, therefore, be advantageous to develop a method for forming a semiconductor structure with a dimension smaller than what is obtainable by the photolithographic equipment used to fabricate the structure. In particular, it would be advantageous to develop such a method that does not undesirably reduce one or more other dimensions of the structure.

SUMMARY OF THE INVENTION

The problems outlined above may be in large part addressed by a method for processing a semiconductor topography. In particular, a method is provided for forming device components laterally spaced within a semiconductor topography. More specifically, a method is provided for fabricating a device, which includes device components and one or more spacings there between that may each have a final dimension that is smaller than a minimum dimension obtainable by a photolithography process used to form the device components. In particular, the method may be used to form a spacing that has a final dimension that is smaller than a minimum dimension obtainable by a photolithography process used to form the device components arranged adjacent to the spacing. In some embodiments, the method may be used to form device components and spacings there between that are arranged along a first dimension parallel to an underlying substrate of the semiconductor topography.

The method may include, for example, patterning an upper layer of the semiconductor topography using a photolithography process to form a first feature having dimensions substantially equal to or greater than the minimum dimension obtainable by the photolithography process. In some cases, the first feature may be a device mask. In such an embodiment, the method may include trimming the device mask and forming a semiconductor structure within underlying layers of the semiconductor topography in alignment with the trimmed device mask. In addition, the method may include patterning the formed semiconductor structure to form device components and spacings therebetween. In another embodiment, the first feature may include an opening. In such a case, the method may include forming a trench within underlying layers of the semiconductor topography in alignment with the opening and subsequently forming one or more device components adjacent thereto.

In general, forming the trench and/or patterning the semiconductor structure may include tapering the first layer of the underlying layers to expose a portion of a second layer of the underlying layers and removing the exposed portion of the second layer. In a preferred embodiment, tapering the first layer of the underlying layers may include exposing the semiconductor topography to an etch chemistry comprising $CH_3F/O_2$, wherein the ratio of $CH_3F$ to $O_2$ is between approximately 5:1 and approximately 10:1. In addition or alternatively, the tapering process may include setting a temperature of a chuck on which the semiconductor topography is positioned. Such a temperature setting may be between approximately 0° C. and approximately 10° C. In either or both cases, tapering the first layer of the underlying layers may include tapering the first layer to an angle between approximately 60 degrees and approximately 90 degrees relative to the upper surface of the second layer. In addition, removing the exposed portion of the second layer may include etching the second layer. In some cases, removing the exposed portion of the second layer may include tapering at least an upper portion of the exposed portion of the second layer. In such an embodiment, tapering a portion of the second layer may include exposing the semiconductor topography to an etch chemistry comprising $Cl_2/HBr$, wherein the ratio of HBr to $Cl_2$ is between approximately 5:1 and approximately 10:1.

As stated above, the method may include patterning an upper layer of a semiconductor topography using a photolithography process to form a device mask having dimensions substantially equal to or greater than the minimum dimension obtainable by the photolithography process. Such a method may further include trimming the device mask. In some cases, the trimming process may include etching an intermediate layer arranged beneath the upper layer. Such an intermediate layer may be an antireflective layer, for example. The method may proceed by forming a semiconductor structure within underlying layers of the semiconductor topography in alignment with the trimmed device mask. In a preferred embodiment, the semiconductor structure may be patterned to form one or more device components. In this manner, the semiconductor structure may be a transitional structure. In some cases, the method may include removing remaining portions of the upper layer and intermediate layer prior to patterning the transitional structure. The removal of the remaining portions of the intermediate layer may be particularly advantageous when the intermediate layer includes organic material. In other embodiments, the method may include removing only remaining portions of the upper layer prior to patterning the transitional structure. In such an embodiment, the intermediate layer may include inorganic material.

In some cases, the method may further include depositing one or more additional layers upon the semiconductor topography subsequent to patterning the upper layer. More specifically, the method may include depositing one or more additional layers upon the semiconductor topography subsequent to forming the first feature. For example, the method may include depositing one or more additional layers upon the semiconductor topography subsequent to forming a trench. In another embodiment, the method may include depositing one or more additional layers upon the semiconductor topography subsequent to forming a semiconductor structure. In particular, the method may include depositing one or more layers upon the semiconductor topography prior to patterning the semiconductor structure. More specifically, the method may include depositing one or more layers upon the semiconductor topography prior to tapering the first layer of the underlying layers for patterning the semiconductor structures.

In some embodiments, depositing the one or more layers may include depositing an anti-reflective layer and a photoresist layer. In such an embodiment, tapering the first layer of the underlying layers to form a trench may include removing portions of the antireflective layer. In addition or alternatively, removing the exposed portion of the second layer of the underlying layers to form the trench may include removing portions of the antireflective layer. In some embodiments, the method may further include etching remaining portions of the anti-reflective layer subsequent to removing the exposed portion of the second layer. Such an etch process may preferably include an etch chemistry which is selective to the anti-reflective layer as compared to the materials of the remaining portions of the first and second layers. In other words, the etch chemistry used to remove remaining portions of the antireflective layer may be substantially absent of substances which may actively etch the materials of the first and second layers. For example, the etch chemistry used during such an etching process may be substantially absent of hydrofluoric acid.

In either embodiment, the one or more additional layers may be patterned using a photolithography process to form a second feature having a dimension substantially equal to or greater than the minimum dimension obtainable by the photolithography process used to form the second feature. In some embodiments, the photolithography process used to form the second feature may be similar to the photolithography process used to form the first feature. Alternatively, the photolithography process used to form the second feature may be different from the photolithography process used to form the first feature. In some cases, the second feature may include an opening arranged above a semiconductor structure or a transitional structure. In such an embodiment, the method may include forming a trench within the semiconductor structure and in alignment with the opening. In this manner, the method may include patterning the one or more additional layers to expose the first layer of the semiconductor structure or transitional structure. In an alternative embodiment, the second feature may include a device mask arranged adjacent to a trench filled with the one or more additional layers. In such a case, the method may include forming device components within underlying layers of the semiconductor topography in alignment with the device mask and adjacent to the trench.

A device is provided herein which includes one or more components having a dimension smaller than a minimum dimension obtainable by photolithographic equipment used to fabricate the device. For example, in an embodiment in which a 248 nm lithographic tool is used to fabricate the device, the minimum dimension obtainable by the tool may be approximately 0.14 microns. Consequently, the device may include components having a dimension smaller than approximately 0.14 microns. In some embodiments, the device may be an integrated circuit. In another embodiment, the device may include a micromechanical device. In either embodiment, the device components may include, for example, processing structures such as gate electrodes or interconnect lines. In one embodiment, the device components may include conductive ribbons used in grating light valve (GLV) micromechanical devices. In a preferred embodiment, the device components may be arranged such that a width of a spacing between two adjacent components is smaller than the minimum dimension obtainable by the photolithographic equipment. In some embodiments, the width of the spacing may be between approximately 30% and approximately 100% of the minimum dimension. More specifically, the width of the spacing may be between approximately 50% and approximately 80% of the minimum dimension. In some embodiments, the device may further include an isolation region arranged beneath the spacing. In some cases, an end of at least one of the components may be arranged over such an isolation region.

The method described herein may offer several benefits. In particular, the method may be used to fabricate a device that has smaller feature sizes than are obtainable by the photolithographic equipment used to pattern the features. Devices with smaller feature sizes may operate at faster speeds and lower voltages. As such, the method may be used to fabricate devices, such as integrated circuits and micromechanical devices, with greater functional characteristics than devices having dimensions equal to or larger than the minimum obtainable dimension of the photolithographic equipment used to pattern the components of the devices. In addition, the method may be used to fabricate a device with smaller dimensions than are obtainable by the photolithographic equipment used to pattern the features of the device without sacrificing other dimensions of the device. For example, the method may allow a gate electrode to have a width smaller than is obtainable by a photolithographic process. However, such a method may not reduce the length of the gate electrode. In this manner, the ends of the gate electrode may extend over isolation regions as required by the design of the device. Moreover, such a method may advantageously allow additional photolithographic equipment purchases to be avoided. Consequently, such a method may drastically reduce fabrication costs.

BRIEF DESCRIPTION OF THE DRAWINGS

Other objects and advantages of the invention will become apparent upon reading the following detailed description and upon reference to the accompanying drawings in which:

FIG. 4 depicts a partial cross-sectional view of the semiconductor topography in which the exposed portions of the hardmask layer and device layer are etched subsequent to the trimmed device mask formations of FIG. 3;

FIG. 5 depicts a partial cross-sectional view of the semiconductor topography in which the remaining portions of the photoresist layer and antireflective layer are removed to form transitional structures subsequent to the etch process of FIG. 4;

FIG. 6 depicts a partial top view of the semiconductor topography of FIG. 5;

FIG. 20 depicts a partial top view of a semiconductor topography, in an alternative embodiment, in which an antireflective layer and a photoresist layer are deposited upon an underlying hardmask layer, device layer and a semiconductor layer;

FIG. 21 depicts a partial top view of the semiconductor topography in which the device layer, hardmask layer, antireflective layer, and photoresist layer are patterned subsequent to the deposition of the antireflective layer and photoresist layer of FIG. 20;

Figure 1:
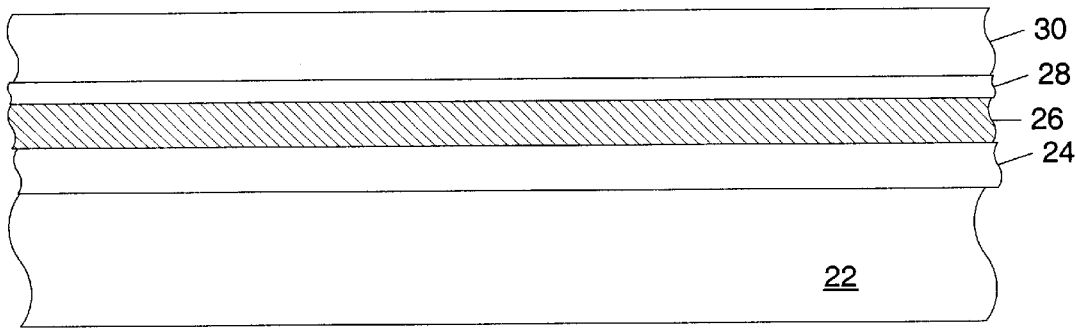
FIG. 1 depicts a partial cross-sectional view of a semiconductor topography in which a device layer, a hardmask layer, an antireflective layer, and a photoresist layer are formed upon a semiconductor layer.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Turning to the drawings, exemplary embodiments of a method for processing a semiconductor topography are shown in FIGS. 1–24. FIG. 1 depicts a partial cross-sectional view of semiconductor topography 20 in which a plurality of layers are formed upon and in contact with each other. In particular, device layer 24 may be formed above semiconductor layer 22 and hardmask layer 26 may be formed above device layer 24. Moreover, antireflective layer 28 may be formed above hardmask layer 26 and resist layer 30 may be formed above antireflective layer 28. In some embodiments, semiconductor topography 20 may include additional layers formed upon and in contact with one or more of the layers shown in FIG. 1.

Semiconductor layer 22 may be a semiconductor substrate such as a monocrystalline silicon, gallium-arsenic, indium phosphide, silicon-germanium, silicon-on-insulator, or silicon-on-sapphire substrate. In addition, semiconductor layer 22 may be doped either n-type or p-type. Alternatively, semiconductor layer 22 may include structures and layers formed upon a semiconductor substrate. The structures and layers may include, but are not limited to, dielectric layers, metallization layers, gate structures, contact structures, vias, or local interconnect wires. In some embodiments, diffusion regions (not shown) may be formed in semiconductor layer 22. For example, diffusion regions may include lightly doped drain regions and heavily doped source/drain regions formed in semiconductor layer 22 adjacent to gate structures. In addition or alternatively, semiconductor layer 22 may include isolation regions (not shown). In general, isolation regions may define the field regions of the semiconductor topography separating the active areas of the topography.

As shown in FIG. 1, device layer 24 may be formed upon an upper surface of semiconductor layer 22. Device layer 24 preferably includes a conductive layer such as, doped polysilicon, aluminum, copper, titanium, tungsten, or a metal alloy. In some embodiments, device layer 24 may further include a dielectric layer. For example, the dielectric layer may be formed beneath the conductive layer serving as a gate dielectric or interlevel dielectric. The dielectric layer may include, for example, silicon dioxide ($SiO_2$), silicon nitride ($Si_xN_y$), silicon dioxide/silicon nitride/silicon dioxide (ONO), or tetraethylorthosilicate glass (TEOS) based silicon dioxide. Device layer 24 may be used to form a process structure of the subsequently formed device. Such a device may be, for example, a four-transistor (4T) or six-transistor (6T) integrated circuit or a micromechanical device. As such, device layer 24 may be used to form gate electrodes or interconnect lines, for example. In one embodiment, device layer 24 may be used to form conductive ribbons of a grating light valve (GLV) micromechanical device.

Hardmask layer 26 may serve to protect portions of underlying layers and structures within semiconductor layer 22 and device layer 24. For example, hardmask layer 26 may protect portions of device layer 24 from an etch process which may be used to form trenches within device layer 24 as described in more detail below. In general, hardmask layer 26 may include any material having substantially different etch characteristics than device layer 24. For example, hardmask layer 26 may include silicon nitride and device layer 24 may include a conductive material such as doped polysilicon or any of the materials noted above for device layer 24. In addition, hardmask layer 26 may have, for example, a thickness between approximately 300 angstroms and approximately 2,500 angstroms and preferably between approximately 1,000 angstroms and approximately 2,000 angstroms. Larger or smaller thicknesses of hardmask layer 26, however, may be appropriate depending on the semiconductor device being formed.

As shown in FIG. 1, antireflective layer 28 may be coated above hardmask layer 26. Antireflective layer 28 preferably includes a material with properties that may aid in producing a profile within overlying resist 30 that meets the design specifications of the device. In other words, the materials used for antireflective layer 28 may have properties that aid in minimizing the reflection of energy back toward an energy source and minimizing standing waves within overlying resist 30 during patterning of the resist layer. In some embodiments, antireflective layer 28 may include inorganic materials such as silicon dioxide or silicon oxynitride. Alternatively, antireflective layer 28 may include organic materials. In some cases, the thickness of antireflective layer 28 may be between approximately 300 angstroms and approximately 1,000 angstroms. Larger or smaller thicknesses of antireflective layer 28, however, may be appropriate depending on the semiconductor device being formed. In particular, the thickness of antireflective layer 28 may be tailored for optimum photolithography effects. For example, the thickness of antireflective layer 28 may be based upon the energy level of the patterning source, the refractive index of the underlying material, and the planarity of the underlying topography. In this manner, the thickness of antireflective layer 28 may be optimized to minimize the amount of energy reflected back to the source and simultaneously planarize the topography such that the depth of focus across the topography may be substantially the same.

Figure 2:
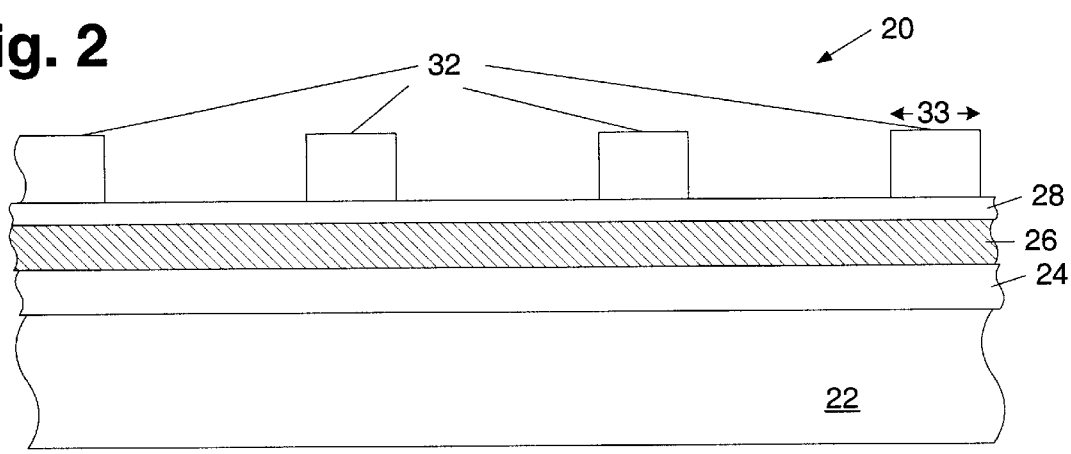
FIG. 2 depicts a partial cross-sectional view of the semiconductor topography in which the photoresist layer of FIG. 1 is patterned to form device masks.

In an embodiment, resist 30 may be formed upon antireflective layer 28. Resist 30 may include a photoresist, such as a deep ultraviolet resist, an I-line resist, a G-line resist, or another resist, such as an e-beam resist or an x-ray resist. Resist 30 may be patterned using a lithography technique to form device masks 32 as shown in FIG. 2. As stated above, the presence of antireflective layer 28 beneath resist 30 may advantageously minimize the amount of energy reflected back up by the underlying topography, thereby minimizing the formation of standing waves within resist 30. Consequently, device masks 32 may include a profile that meets the design specifications of the device.

The lithography technique may include using photolithographic equipment of a certain wavelength. For example, the lithography technique may include using a 248 nm or 193 nm photolithographic tool. In general, lithographic tools of any wavelength, which are known in the semiconductor fabrication industry, may be used, depending on the particular process specifications of the device. As such, lithographic tools using smaller or larger wavelengths may be used for the process described herein. Typically, the minimum resolvable dimension produced by photolithographic equipment depends on the wavelength used during the photolithography process. For example, in an embodiment in which a 248 nm lithographic tool is used, the minimum dimension obtainable by the tool may be approximately 0.14 microns. As such, the photolithographic equipment may be used to form structures with dimensions equal to or greater than the minimum resolvable dimension of the photolithographic equipment. For example, the lithography process used in FIG. 2 may result in device masks 32 having dimensions equal to or greater than the minimum resolvable dimension of the photolithographic equipment used to pattern the device masks. More specifically, in an embodiment in which a 248 nm photolithographic tool is used, for example, device masks 32 may include dimensions equal to or greater than approximately 0.14 microns.

Figure 3:
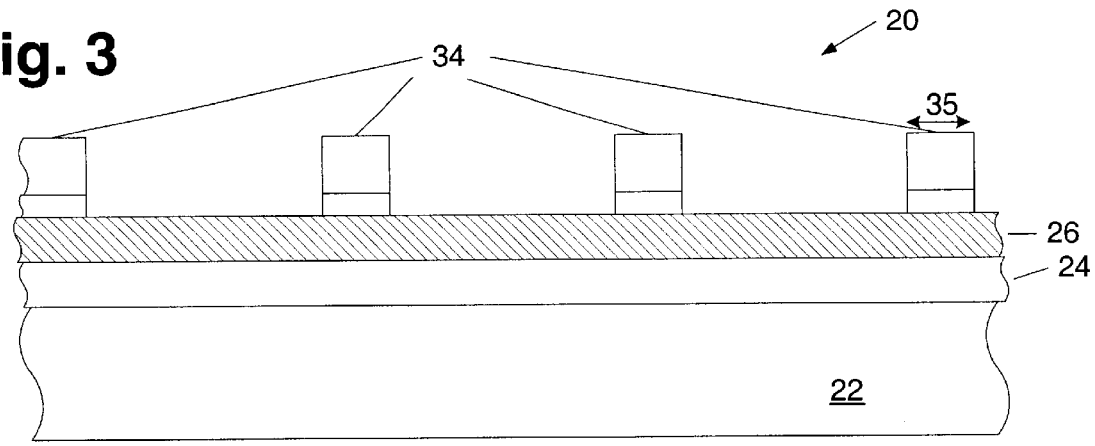
FIG. 3 depicts a partial cross-sectional view of the semiconductor topography in which the antireflective layer is etched and the device masks are trimmed subsequent to the device mask formation of FIG. 2.

After patterning device masks 32 within resist 30, the exposed portions of antireflective layer 28 may be etched to form device masks 34 as shown in FIG. 3. The etch process may include wet etch and/or more preferably dry etch techniques. In some embodiments, the etch process may include an etch chemistry comprising $CHF_3/CF_4$, for example. In a preferred embodiment, the etch process may be continued such that antireflective layer 28 is "overetched." Such an overetch step may consecutively "trim" remaining portions of resist 30 such that the width, length, and height of device masks 32 are reduced. In addition, antireflective layer 28 may be etched in alignment with resist 30 such that the width and length of antireflective layer 28 is further reduced to form device masks 34. In this manner, the length and width of device masks 34 may be less than the length and width of device masks 32. For example, width 35 of device mask 34 may be less than width 33 of device mask 32.

The amount of the reduction may depend on the trimming process and the design specifications of the device. In general, the trimming process may be optimized to decrease the smallest dimension of the structure to a specific percentage of its original dimension. For example, the trimming process may be optimized to reduce the width of device masks 32 by up to approximately 50% of the patterned dimension. In addition, the trimming process may reduce the length of subsequently formed structures 38. However, such a reduction in length may not adversely affect the fabrication of device components from structures 38 since the individual device components formed from structures 38 have not been patterned. In other words, the reduction of the length of device masks 32 may not be sufficient to prevent the fabrication of device components from subsequently formed structures 38 as shown and described in more detail below.

Prior to the formation of structures 38, another etch process may be used to form structures 36 as shown in FIG. 4. Device masks 34 may be used to protect underlying portions of hardmask layer 26 and device layer 24 from such an etch process. The etch process may include wet etch and/or more preferably dry etch techniques. In addition, the etch process may include one or more etch steps using one or more etch chemistries. In some embodiments, structures 36 may be referred to as "transitional" structures since final device components will be fabricated from them. Although FIG. 4 illustrates the formation of four structures, any number of structures may be formed across semiconductor topography 20 in accordance with design specifications of the device. In addition, the structures may be formed with various dimensions and spacings therebetween in accordance with the design specifications of the device. Trimmed resist 30 and antireflective layer 28 may be subsequently removed to form transitional structures 38 as shown in FIG. 5. Such a removal may be done by a stripping process such as a wet etch, a downstream plasma, or a reactive ion etch stripping process. In an alternative embodiment, trimmed antireflective layer 28 may not be removed from structures 36. As explained in more detail below, it may be advantageous to remove antireflective layer 28 from semiconductor topography 20 when the layer includes an organic material. In embodiments in which antireflective layer 28 includes an inorganic material, it may be advantageous keep the layer within semiconductor topography 20 for subsequent processing.

FIG. 6 shows a partial top view of semiconductor topography 20 subsequent to the removal of resist 30 and antireflective layer 28 as described above. As illustrated, semiconductor topography 20 may include additional structures laterally spaced across semiconductor layer 22 beyond those shown in FIG. 5. As stated above, such structures may include various dimensions and spacings therebetween in accordance with the design specifications of the device. Structures 38 are shown to extend across active regions 40 and isolation regions 42 of semiconductor layer 22. In some embodiments, isolation regions 42 may be trench isolation regions formed within semiconductor layer 22. Alternatively, isolation regions 42 may be formed upon semiconductor layer 22 such that they are laterally adjacent to the lower portions of structures 38. The cross-sectional view of FIG. 5 may be taken, for example, along line A of FIG. 6. Consequently, isolation regions 42 are not shown in semiconductor layer 22 of FIGS. 1–5.

Figure 7:
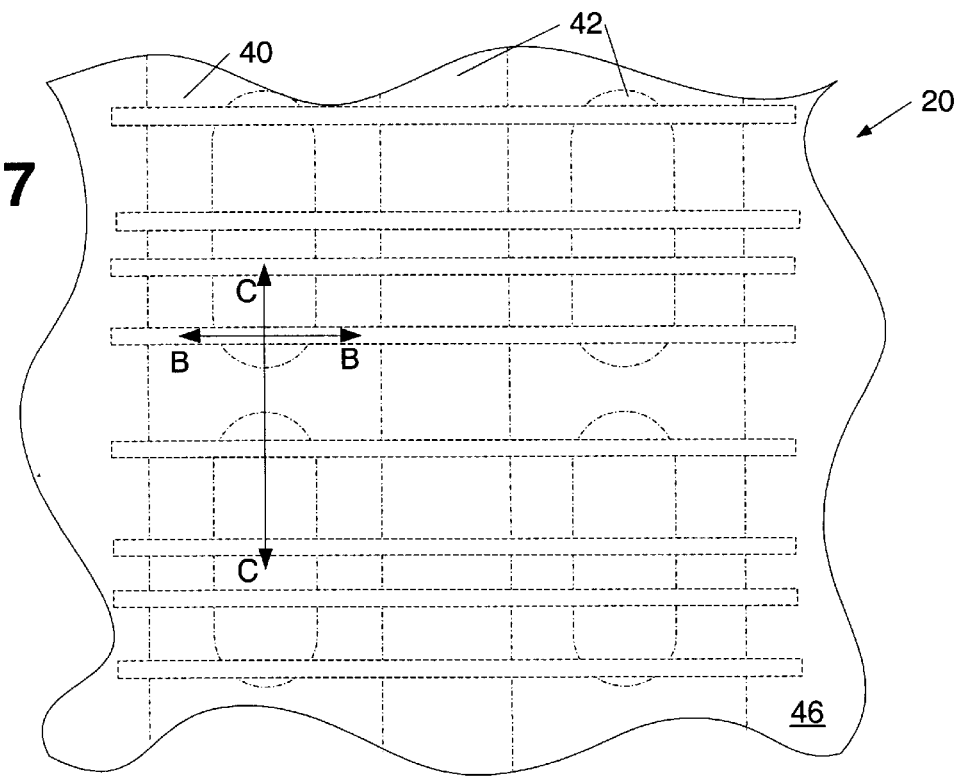
FIG. 7 depicts a partial top view of the semiconductor topography in which a different antireflective layer and a different photoresist layer are deposited upon the semiconductor topography subsequent to the formation of the transitional structures of FIG. 6.
Figure 8:
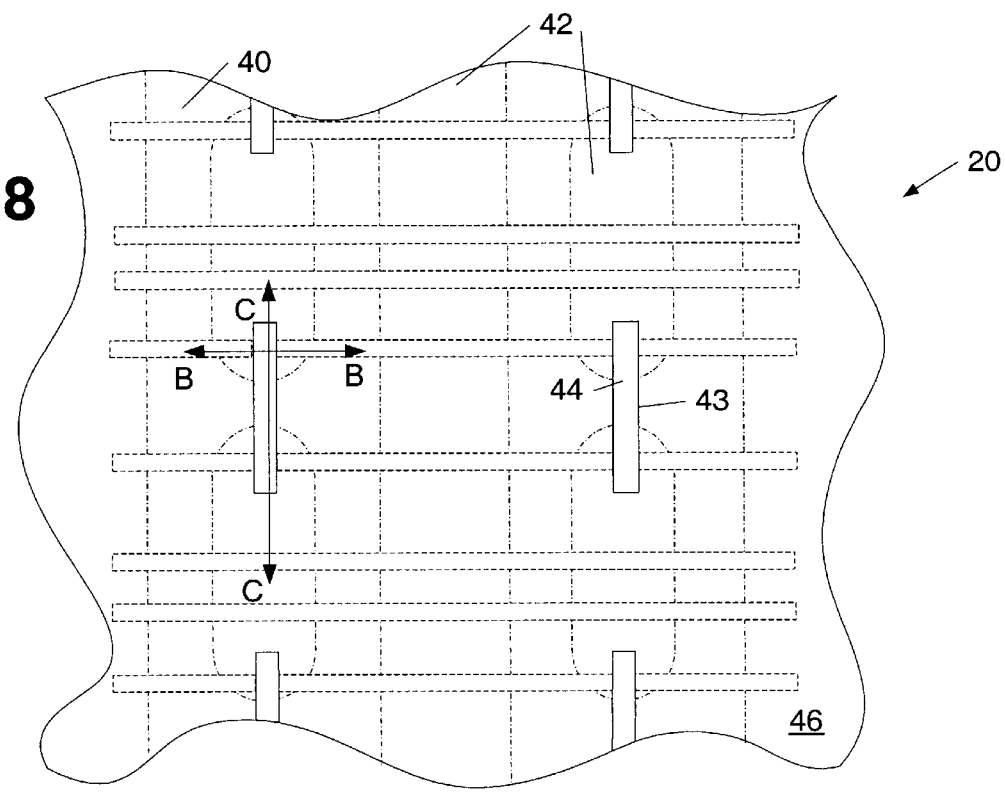
FIG. 8 depicts a partial top view of the semiconductor topography in which the different photoresist layer is patterned subsequent to the deposition of the different antireflective layer and different photoresist layer of FIG. 7.
Figure 9:
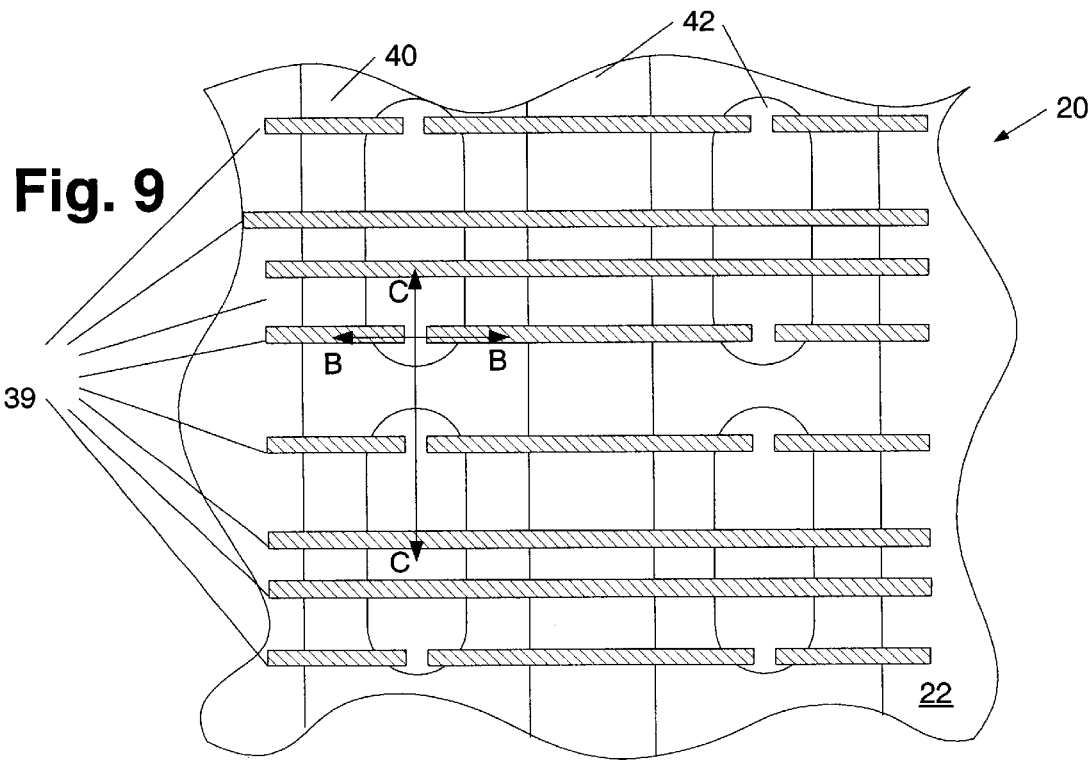
FIG. 9 depicts a partial top view of the semiconductor topography in which transitional structures are patterned and remaining portions of the different antireflective layer and different photoresist layer are removed subsequent to patterning the different photoresist layer in FIG. 8.

Subsequent to the removal of resist 30 and in some embodiments, antireflective layer 28, structures 38 may be patterned to form device components 39 as illustrated in FIG. 9. Such a patterning process is illustrated in FIGS. 7–9. In particular, FIG. 7 illustrates a top view of semiconductor topography 20 with photoresist layer 46 coated upon the upper surface of semiconductor topography 20. Structures 38, active regions 40, and isolation regions 42 are outlined by dotted lines indicating that they are arranged beneath photoresist layer 46. As shown in FIG. 8, photoresist layer 46 may be patterned to form openings 43 to expose portions of underlying antireflective layer 44 which may be interposed between photoresist layer 46 and the underlying topography of structures 38 and semiconductor layer 22. The deposition of photoresist layer 46 and underlying antireflective layer 44 upon semiconductor topography 20 is described in more detail in FIG. 10 below.

The exposed portions of antireflective layer 44 and respective underlying portions of structures 38 may be etched. In addition, remaining portions of antireflective layer 44 and photoresist layer 46 may be subsequently removed. In some embodiments, remaining portions of hardmask layer 26 may be removed (not shown). In other embodiments, remaining portions of hardmask layer 26 may be retained above remaining portions of device layer 24. As a result, semiconductor topography 20 may include device components 39 formed from structures 38 as shown in FIG. 9. In general, the patterning process illustrated in FIGS. 7–9 may involve patterning structures 38 into several different configurations. For example, device components 39 may be patterned such that the length of the components may be longer or shorter. As such, the patterning process may result in a greater number of device components in some embodiments. In other embodiments, the patterning process may result in a fewer number of device components.

Figure 10:
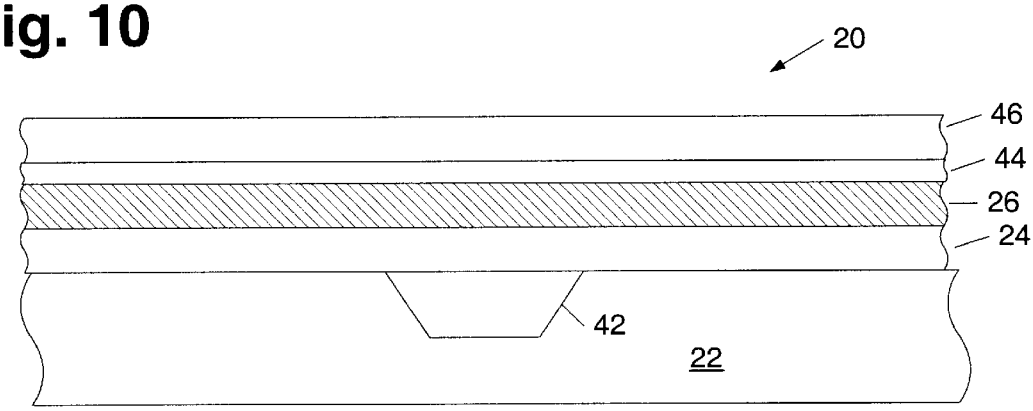
FIG. 10 depicts a partial cross-sectional view of the semiconductor topography along line BB of FIG. 7 in which the different antireflective layer and different photoresist layer are deposited upon one of the transitional structures subsequent to the formation of the transitional structures of FIG. 6.

The patterning process illustrated in FIGS. 7–9 may also be illustrated through different cross-sectional views of semiconductor topography 20. For example, FIGS. 10–13 illustrate the partial cross-sectional view of semiconductor topography 20 along the length of one of structures 38 during the patterning process. In particular, the cross-sectional view of FIGS. 10–13 may be taken along line BB of FIGS. 7–9. Since line BB extends over a portion of isolation region 42, the cross-sectional view of semiconductor topography 20 along such a line may include isolation region 42 within semiconductor layer 22 as shown in FIG. 10. In addition, FIG. 10 illustrates a partial cross-sectional view of semiconductor topography 20 subsequent to the deposition of antireflective layer 44 and photoresist layer 46 upon the semiconductor topography containing structures 38. Since the cross-sectional view of FIG. 10 is taken along the length of one of structures 38, antireflective layer 44 and photoresist layer 46 are shown arranged upon the upper surface of hardmask layer 26. However, the deposition of antireflective layer 44 and photoresist layer 46 may be deposited across the entirety of semiconductor topography 20 and therefore, may also be formed upon exposed surfaces of semiconductor layer 22 as shown and described in FIG. 15 below.

Antireflective layer 44 and photoresist layer 46 may contain similar materials to that of antireflective layer 28 and resist 30 used in FIGS. 1 and 2. As such, photoresist layer 46 may include a photoresist, such as a deep ultraviolet resist, an I-line resist, a G-line resist, or another resist, such as an e-beam resist or an x-ray resist. Antireflective layer 44, on the other hand, preferably includes a material with properties that aid in minimizing the reflection of energy back toward an energy source and minimizing standing waves within overlying photoresist layer 46 during patterning of the resist layer. In addition, antireflective layer 44 may advantageously protect semiconductor layer 22 from subsequent etch processes used to form device components 39. In general, antireflective layer 44 may include an inorganic or organic material. The thickness of antireflective layer 44 may be between approximately 400 angstroms and approximately 3,000 angstroms. Larger or smaller thicknesses of antireflective layer 44, however, may be appropriate depending on the semiconductor device being formed.

In an embodiment in which antireflective layer 28 from FIGS. 1–4 includes an inorganic material, antireflective layer 28 may remain above structures 38. In such an embodiment, antireflective layer 44 may be formed upon antireflective layer 28 and adjacent portions of semiconductor topography 20. Alternatively, antireflective layer 28 may be removed subsequent to the formation of structures 36 in FIG. 4. In this case, antireflective layer 44 may be formed upon structures 38 and adjacent portions of semiconductor topography 20. Such an embodiment may be particularly advantageous when antireflective layer 28 includes an organic material.

Figure 11:
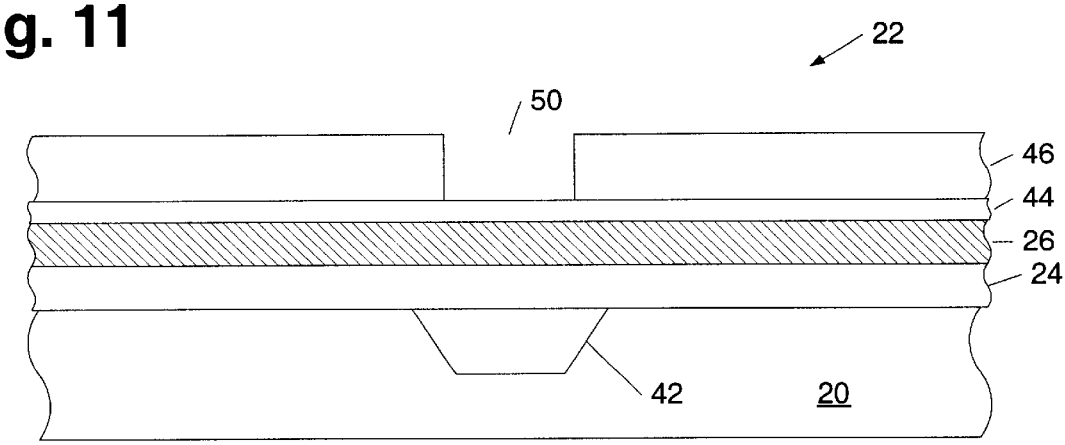
FIG. 11 depicts a partial cross-sectional view of the semiconductor topography in which the different photoresist layer of FIG. 10 is patterned to form device masks.

Photoresist layer 46 may be patterned using a lithography technique to form opening 50 as shown in FIG. 11. As stated above, the presence of antireflective layer 44 beneath photoresist layer 46 may advantageously minimize the amount of energy reflected back up by the underlying topography, thereby minimizing the formation of standing waves within photoresist layer 46. Consequently, opening 50 may include a profile that meets the design specifications of the process step. In general, the width of opening 50 may be equal to or greater than the minimum resolvable dimension of the photolithographic equipment. For example, in an embodiment in which a 248 nm lithographic tool is used to pattern opening 50, the minimum dimension obtainable by the tool may be approximately 0.14 microns. Consequently, opening 50 may include dimensions equal to or greater than approximately 0.14 microns. In some cases, the photolithography equipment used to form opening 50 may be similar to the equipment used to form device masks 32 in the patterning step of FIG. 2. As such, the width of opening 50 may be approximately the same as the width of device masks 32. Alternatively, the width of opening 50 may be smaller or larger than the width of device masks 32 depending on the design specifications of the device.

Figure 12:
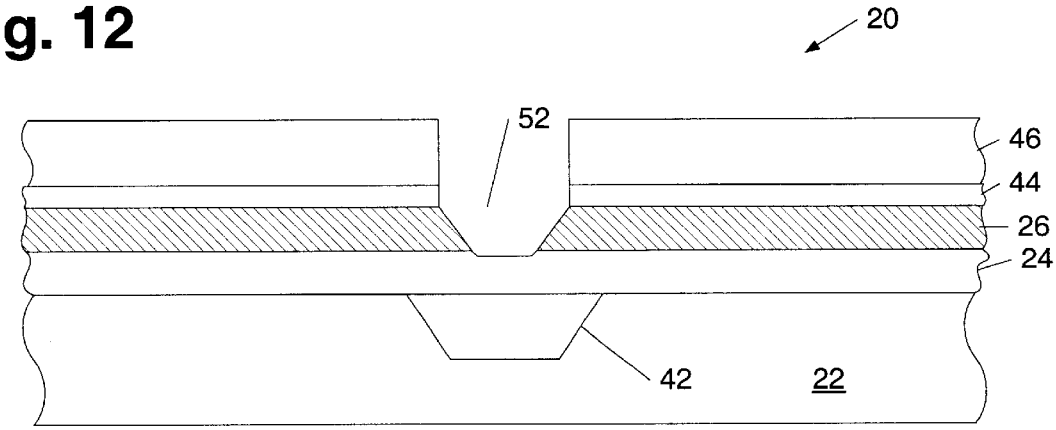
FIG. 12 depicts a partial cross-sectional view of the semiconductor topography in which the exposed portions of the different antireflective layer are removed and the hardmask layer is tapered subsequent to the device mask formations of FIG. 11.

FIG. 12 illustrates semiconductor topography 20 subsequent to etching exposed portions of antireflective layer 44 and tapering exposed portions of hardmask layer 26. In general, the etch process of antireflective layer 44 and tapering process of hardmask layer 26 may be distinct etch processes using different etch chemistries. Alternatively, the etch processes of antireflective layer 44 and tapering process of hardmask layer 26 may include the same etch chemistry. In either embodiment, etching the antireflective layer may include etching the exposed portion of antireflective layer 44 within opening 50 to expose the upper surface of hardmask layer 26. As stated above, antireflective layer 44 is preferably deposited across the entirety of semiconductor topography 20. As such, the etch process of antireflective layer 44 may include etching portions of antireflective layer 44 adjacent to structure 38. Such a removal of antireflective layer 44 is shown and described in more detail in FIG. 17 below. The etch chemistry used during the etch process of antireflective layer 44 may be selective to the material of hardmask layer 26 in order to minimize the amount of hardmask layer 26 etched during such a process. Chemistries known for such an etch process in the semiconductor fabrication industry may be used.

The tapering process may include etching exposed portions of hardmask layer 26 to form trench 52. As shown in FIG. 12, such a tapering process may further include etching a portion of device layer 24. The overetch of such a layer may insure that a sufficient amount of hardmask layer 26 is removed in order to expose device layer 24. The tapering process preferably includes an etch chemistry that is selective to the material of antireflective layer 44 and/or photoresist 46. In this manner, the active regions and isolation regions of semiconductor layer 22 underlying antireflective layer 44 may be protected from the etching process. For example, the chemistry may include $CH_3F/O_2$. Other chemistries known in the semiconductor fabrication industry for being selective to antireflective materials may also be used depending on the materials of hardmask layer 26 and device layer 44. Although the etch chemistry used during the tapering process may be selective to antireflective layer 44, portions of antireflective layer 44 adjacent to hardmask layer 26 may be etched during the tapering process. Such a removal of antireflective layer 44 is shown and described in FIG. 17 below.

In addition, the tapering process preferably includes an etch chemistry which produces a tapered profile. The tapering of hardmask layer 26 may depend on the ratio the chemicals in the etch chemistry. For example, in an embodiment in which $CH_3F/O_2$ is used as the etch chemistry, the ratio of $CH_3F$ to $O_2$ may be between approximately 5:1 and approximately 10:1. In a preferred embodiment, the ratio of $CH_3F:O_2$ may be approximately 10:1. In general, a more tapered angled is produced with a higher $CH_3F:O_2$ ratio. More specifically, the higher the $CH_3F:O_2$ ratio, the smaller the angle of hardmask layer 26 with respect to the upper surface of device layer 24. Alternatively stated, the higher the $CH_3F:O_2$ ratio, the larger the angle of hardmask layer 26 with respect to the sidewall of opening 50. In some embodiments, the etch chemistry of the tapering process may produce angles of hardmask layer 26 between approximately 60 degrees and approximately 90 degrees with respect to the upper surface of device layer 24. Larger and smaller angles may be obtained, however, depending on the etch chemistry used to taper hardmask layer 26.

The temperature of the etch process may also affect the ability of the etch chemistry to taper hardmask layer 26. In particular, cooling topography 20 may advantageously produce a more tapered profile. Cooling topography 20 may be conducted in several manners. In one embodiment, the temperature of the chuck attached to the backside of semiconductor topography 20 during the etch process may be reduced. For example, the chuck temperature may be reduced from approximately 20° C. to between approximately 0° C. and approximately 10° C. In a preferred embodiment, the chuck temperature may be approximately 0° C. Such a reduction in chuck temperature may be facilitated by increasing the gas flow to the backside of semiconductor topography 20 or reducing the temperature setting of a chiller used to control the temperature of the etch process. In either embodiment, the reduction in chuck temperature may reduce the temperature of semiconductor topography 20 to between approximately 80° C. and approximately 90° C.

Figure 13:
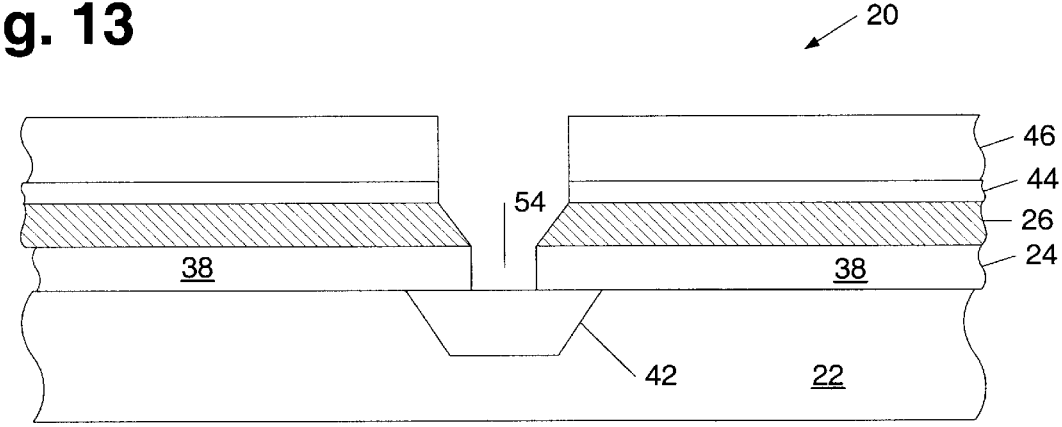
FIG. 13 depicts a partial cross-sectional view of the semiconductor topography in which the exposed portion of the device layer is removed to form a trench within the transitional structure subsequent to the tapering process of FIG. 12.

Subsequent to the tapering process, spacing 54 may be etched into device layer 24 as shown in FIG. 13. Such an etch process may form device components 39. In an embodiment in which device components 39 include gate structures, the width of spacing 54 may be preferably smaller than the width of isolation region 42. In this manner, the occurrence of a failure within the subsequently formed device may be reduced. In some embodiments, the tapering process of FIG. 12 may allow spacing 54 to be formed at a width smaller than the minimum resolvable dimension of the photolithography equipment used to pattern photoresist layer 46. Alternatively, spacing 54 may be formed at a width equal to or greater than the minimum resolvable dimension of the photolithography equipment used to pattern photoresist layer 46. In either embodiment, the tapering of hardmask layer 26 may allow the formation of device components 39 to be in close proximity to each other. In this manner, device components of reduced width may be produced without sacrificing the length of the device component. In particular, device components 39 may be fabricated such that their ends extend over isolation regions 42 of semiconductor layer 22 while their widths may be smaller than the minimum resolvable dimension of the photolithography equipment used to pattern opening 50 in FIG. 11.

The etch process used to form spacing 54 may include a different etch chemistry than is used to taper hardmask layer 26. For example, the etch chemistry used to form spacing 54 may be selective to oxide and the material of photoresist layer 46. Such selectivity may prevent etching into underlying isolation region 42. For example, in an embodiment in which device layer 24 includes polysilicon, an etch chemistry with the desired selectivity may include $Cl_2/HBr$ with the addition of He and $O_2$. In such an embodiment, the $HBr:Cl_2$ ratio may be approximately 5:1. Such an etch chemistry may produce spacing 54 with substantially perpendicular sidewalls. In an alternative embodiment (not shown), the etch chemistry may produce a spacing with tapered sidewalls similar to trench 52 in FIG. 12. In such an embodiment, the ratio of the elements of the etch chemistry may be different than with the etch chemistry used to produce substantially perpendicular sidewalls. For example, the $HBr:Cl_2$ ratio may be greater than approximately 5:1 in such an embodiment and more preferably greater than approximately 10:1. In a preferred embodiment, the $HBr:Cl_2$ ratio may be between approximately 5:1 and approximately 10:1.

Figure 14:
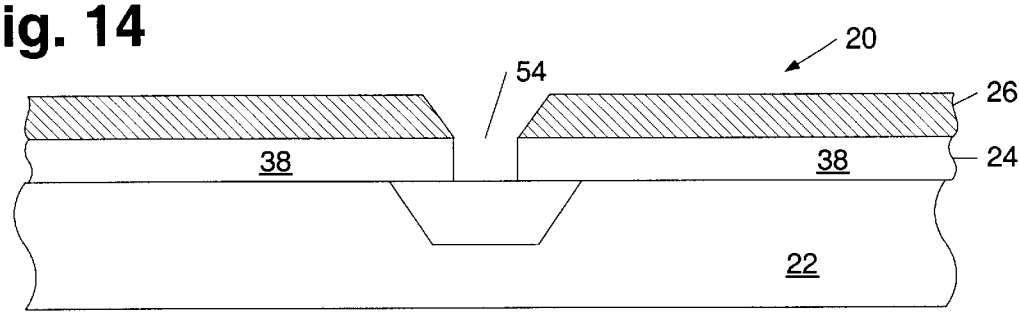
FIG. 14 depicts a partial cross-sectional view of the semiconductor topography in which the remaining portions of the different photoresist layer and different antireflective layer are removed subsequent to the trench formation of FIG. 13.

FIG. 14 illustrates semiconductor topography 20 subsequent to the removal of photoresist layer 46 and antireflective layer 44 to expose device components 39 as similarly shown in FIG. 9. In other embodiments, hardmask layer 26 may be removed in addition to photoresist layer 46 and antireflective layer 44. In either embodiment, such a removal process preferably includes one or more etch chemistries adapted to remove each of the layers. In a preferred embodiment, the etch chemistry used to remove antireflective layer 44 is selective to the materials of the remaining portions of hardmask layer 26 and device layer 24 as compared to anti-reflective layer 44. In other words, the etch chemistry used to remove remaining portions of antireflective layer 44 may be substantially absent of substances which may actively etch the materials of hardmask layer 26 and device layer 24. For example, the etch chemistry used during such an etching process may be substantially absent of hydrofluoric acid (HF). The presence of HF or other chemical substances able to etch the materials of hardmask layer 26 and/or device layer 24 may undesirably affect the electrical characteristics of silicon within semiconductor layer 22.

Figure 15:
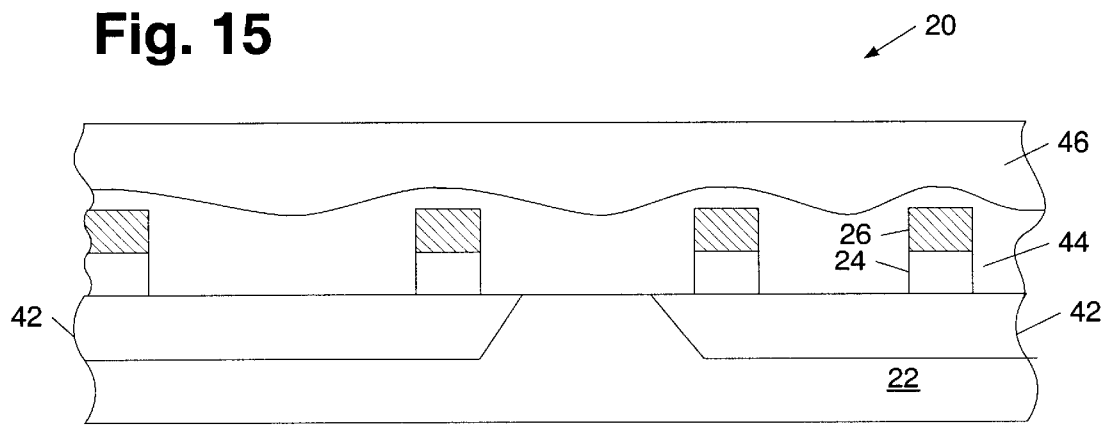
FIG. 15 depicts a partial cross-sectional view of the semiconductor topography along line CC of FIG. 7 in which the different antireflective layer and different photoresist layer are deposited subsequent to the formation of the transitional structures of FIG. 6.
Figure 16:
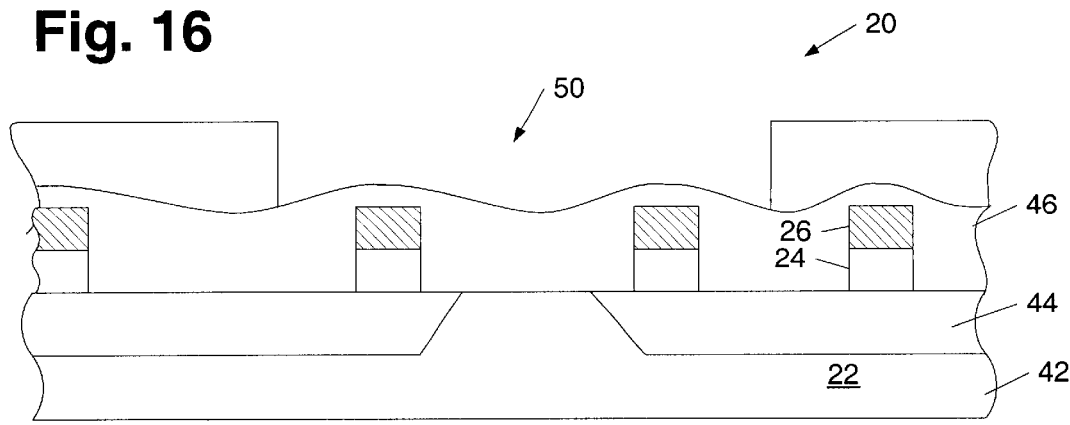
FIG. 16 depicts a partial cross-sectional view of the semiconductor topography in which the different photoresist layer of FIG. 15 is patterned.

FIGS. 15–19 illustrate the formation of device components 39 using a different cross-sectional view of semiconductor topography 20. In particular, FIGS. 15–19 illustrate the patterning of structures 38 along line CC in semiconductor topography 20 of FIGS. 7–9. Since line CC extends over portions of isolation regions 42, the cross-sectional view of semiconductor topography 20 along such a line may include isolation regions 42 within semiconductor layer 22 as shown in FIGS. 15–19. FIG. 15 illustrates the deposition of antireflective layer 44 and photoresist layer 46 upon the upper surface of structures 38 and adjacent portions of semiconductor layer 22. In particular, antireflective layer 44 may be deposited to a depth such that the upper surface of the antireflective layer is approximately level with structures 38. Alternatively, antireflective layer 44 may be deposited to a depth such that the upper surface of the antireflective layer is above structures 38. Photoresist layer 46 may be patterned to form opening 50 as shown in FIG. 16. Such an opening is shown to span over two of structures 38, but may, in some embodiments, span over fewer or more structures depending on the design specifications of the device. Following the formation of such an opening, antireflective layer 44 may be etched to expose the surface of hardmask 26 (not shown) as described in regard to FIG. 12 above.

Figure 17:
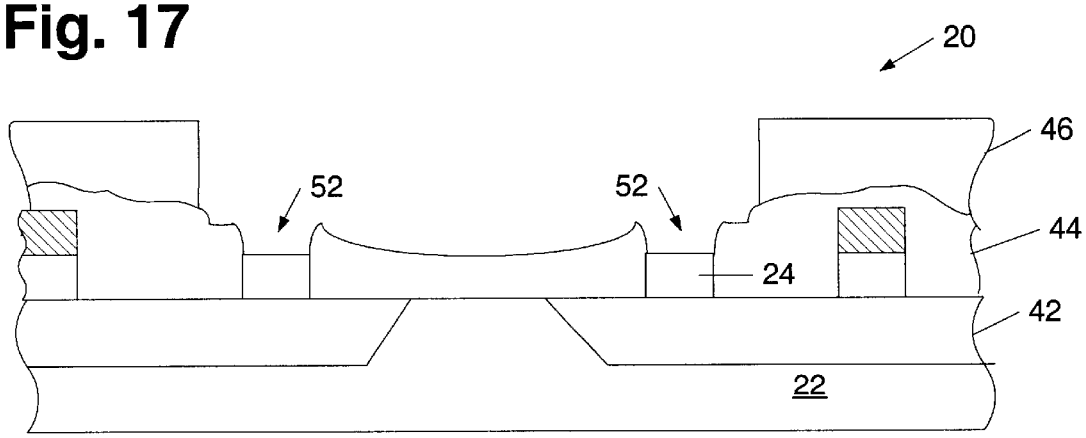
FIG. 17 depicts a partial cross-sectional view of the semiconductor topography in which the exposed portions of the different antireflective layer are removed and the hardmask layer is tapered subsequent to the patterning the photoresist layer in FIG. 16.
Figure 18:
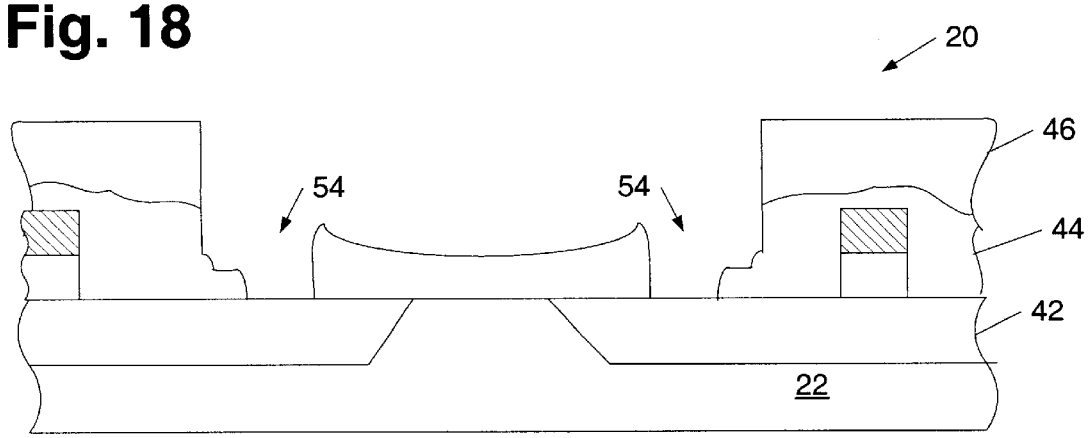
FIG. 18 depicts a partial cross-sectional view of the semiconductor topography in which the exposed portion of the device layer is removed subsequent to the tapering process of FIG. 17.
Figure 19:
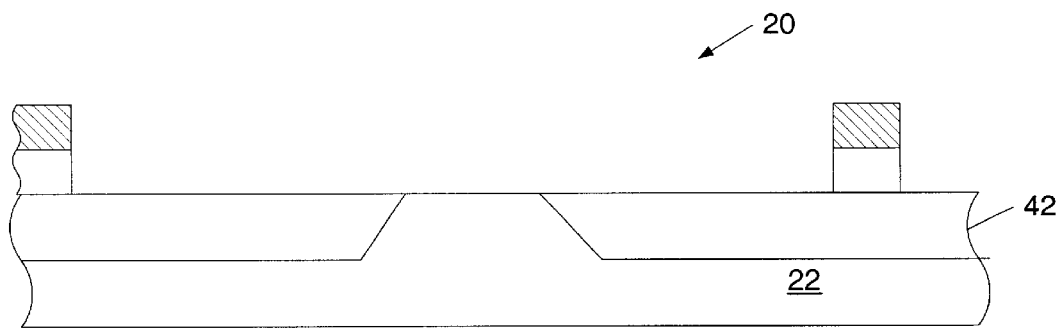
FIG. 19 depicts a partial cross-sectional view of the semiconductor topography in which the remaining portions of the photoresist layer, antireflective layer, and hardmask layer are removed subsequent to the removal of the portion of the device layer in FIG. 18.

Subsequently, hardmask layer 26 may be tapered similar to the manner described in FIG. 12 above. Consequently, the portion of hardmask layer 26 shown in the cross-sectional view of FIG. 17 may be removed to expose underlying device layer 24. As noted above, the etch chemistry used during such a tapering process is preferably selective to antireflective layer 44. In this manner, hardmask layer 26 may be etched at a faster rate than antireflective layer 44. As such, antireflective layer 44 may be not be etched to the down to the level of device layer 24 as shown in FIG. 17. Following the tapering process of hardmask layer 26, the exposed portion of device layer 24 may be etched to form spacings 54 as shown in FIG. 18. Subsequent to the formation of spacings 54, remaining portions of photoresist layer 46 and antireflective layer 44 may be removed as described in FIG. 14 above. As a result, the cross-sectional view of semiconductor topography 22 taken along line CC may appear as the topography illustrated in FIG. 19. In a preferred embodiment, the etch chemistry used to remove antireflective layer 44 is absent of chemical substances, such as hydrofluoric acid (HF), which are adapted to actively etch the materials of hardmask layer 26 and device layer 24. The presence of such a chemical substance may undesirably affect the electrical characteristics of silicon within semiconductor layer 22.

In an alternative embodiment, the spacings between device components may be formed prior to patterning the structures of the device components. Such an embodiment is illustrated and described in FIGS. 20–23 below. In particular, FIG. 20 includes a top view of semiconductor topography 70 prior to the formation of spacings and device components. Semiconductor topography 70 may be similar to semiconductor topography 20 of FIG. 1. In particular, semiconductor topography 70 may include a similar arrangement of layers as semiconductor topography 20 illustrated in FIG. 1. More specifically, the semiconductor topography 70 may include a device layer, a hardmask layer, an antireflective layer, and a resist similar to the layers of semiconductor topography 20 of FIG. 1. In addition, semiconductor topography 70 may include active regions 60 and isolation regions 62 outlined by dotted lines, indicating that they are arranged beneath the layers of semiconductor topography 70.

The resist layer may be patterned to form openings 74 above the antireflective layer as shown in FIG. 21. The exposed portions of the antireflective layer may be etched along with underlying portions of the hardmask layer and device layer in a similar manner as the process described in FIGS. 10–13. In this way, the hardmask layer may be tapered to form trenches within the device layer. In one embodiment, the width of the trenches may be smaller than the minimum resolvable dimension of the photolithography equipment used to pattern the resist layer. Alternatively, the width of the trenches may be equal to or greater than the minimum resolvable dimension of the photolithography equipment used to pattern the resist layer to form the spacing.

Figure 22:
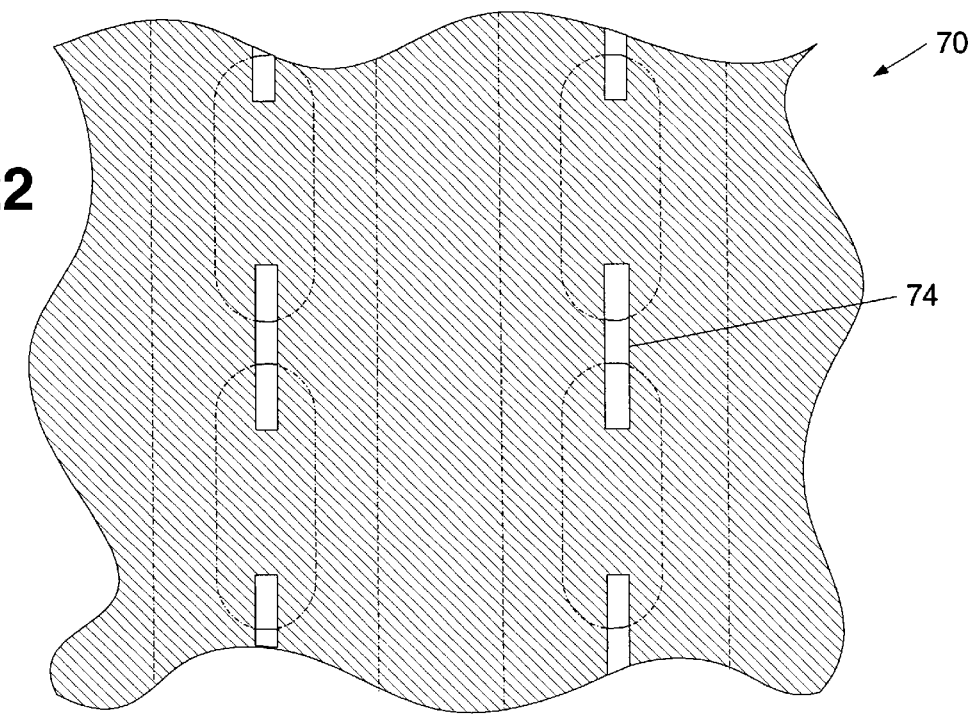
FIG. 22 depicts a partial top view of the semiconductor topography in which remaining portions of the antireflective layer and photoresist layer are removed subsequent to patterning of the layers of FIG. 21.
Figure 23:
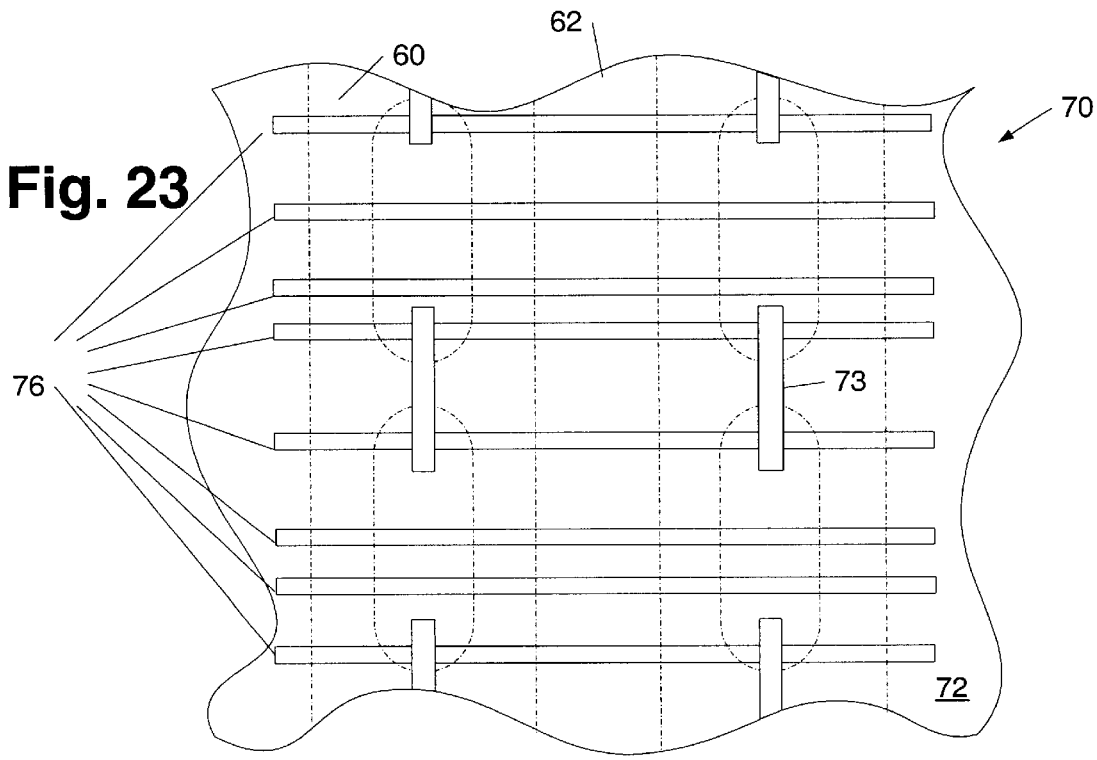
FIG. 23 depicts a partial top view of the semiconductor topography in which a different antireflective layer and photoresist layer are deposited and patterned subsequent to the removal of the first antireflective layer and photoresist layer in FIG. 22.
Figure 24:
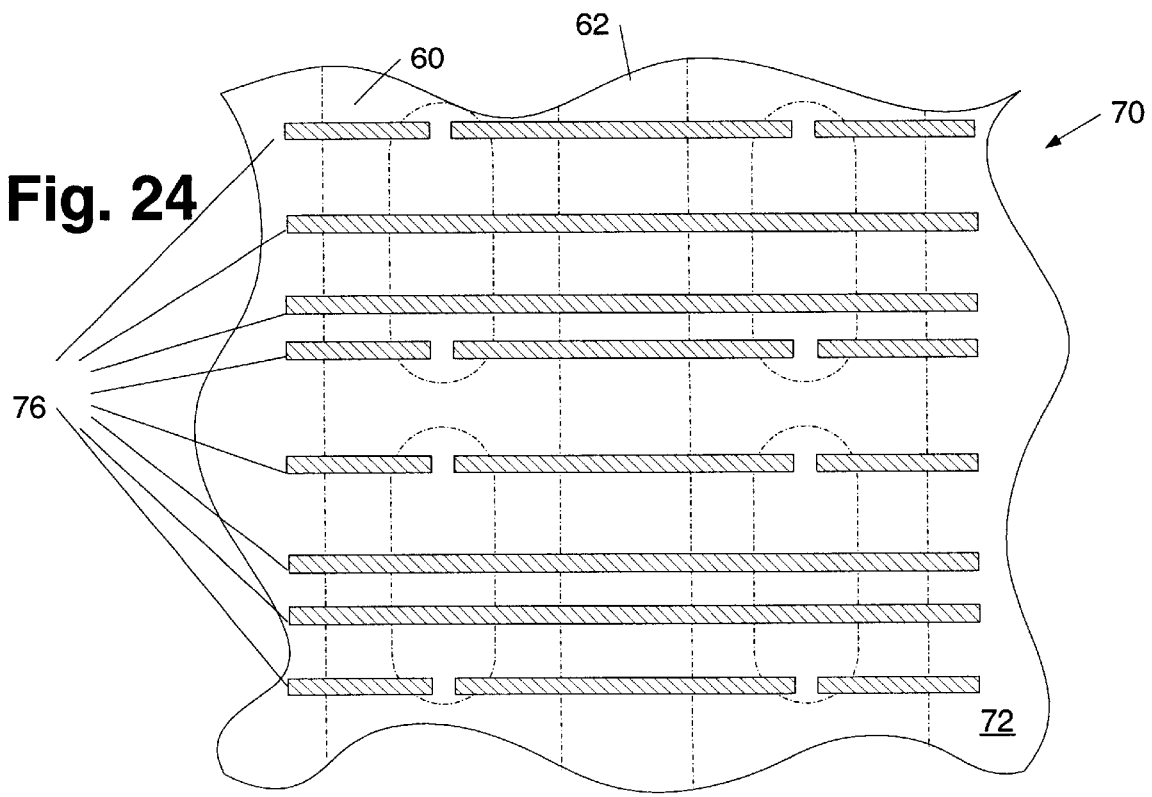
FIG. 24 depicts a partial top view of the semiconductor topography in which the remaining portions of the hardmask layer and device layer are patterned to form device components subsequent to the patterning of the different anti reflective layer and photoresist layer of FIG. 23.

Subsequent to the formation of the trenches, remaining portions of the resist layer and antireflective layer may be removed to expose remaining portions of the hardmask layer as shown in FIG. 22. Alternatively, the antireflective layer may not be removed. Such an embodiment may be particularly advantageous when the anti-reflective layer includes inorganic materials. In either embodiment, an additional antireflective layer and photoresist layer may be deposited upon semiconductor topography 70 after the removal of the prior layers. Subsequently, the second photoresist layer may be patterned to openings 73 to subsequently form device masks in a similar manner to FIG. 2. In a preferred embodiment, openings 73 may be patterned laterally adjacent to the previously formed trenches as shown in FIG. 23. Following patterning of the photoresist layer, exposed portions of semiconductor topography 70 may be etched following a similar process described in FIGS. 3 and 4 above. As such, device components 76 may be formed underlying the device masks and laterally adjacent to the previously formed trenches as shown in FIG. 24.

Since the trenches adjacent to device components 76 were preferably formed to a dimension smaller than the minimum resolvable dimension of the photolithography equipment used to pattern the resist layer as described in FIG. 21 above, patterning device components 76 from semiconductor topography 70 subsequent to the formation of trenches may not adversely affect the length of the component device. In other words, the formation of a trench with a dimension smaller than the minimum resolvable dimension of the photolithographic equipment used to pattern the trench may compensate for the reduction in length of the subsequently formed device components. In this manner, device components of reduced width may be produced without sacrificing the length of the device component. In particular, device components 76 may be fabricated such that their ends extend over isolation regions 62 of semiconductor layer 72 while their widths may be smaller than the minimum resolvable dimension of the photolithography equipment used to pattern the device components.

It will be appreciated to those skilled in the art having the benefit of this disclosure that this invention is believed to provide a method for processing a semiconductor topography. Further modifications and alternative embodiments of various aspects of the invention will be apparent to those skilled in the art in view of this description. For example, device components of various sizes and shapes may be formed using the method described herein. Furthermore, photolithographic equipment of any wavelength known to those in the semiconductor fabrication industry may be used as appropriate. For instance, 248 nm and/or 193 nm photolithographic tools may be used. It is intended that the following claims be interpreted to embrace all such modifications and changes and, accordingly, the drawings and the specification are to be regarded in an illustrative rather than a restrictive sense.

What is claimed is:

1. A method for forming device components laterally spaced within a semiconductor topography, wherein first and second device components and a spacing between the first and second device components each comprise a final dimension that is smaller than a minimum dimension obtainable by a photolithography process used to form the device components.

2. The method of claim 1, comprising patterning an upper layer of the semiconductor topography using the photolithography process to form a first feature having dimensions substantially equal to or greater than the minimum dimension.

3. The method of claim 2, wherein the first feature comprises a device mask, and wherein the method further comprises:

trimming the device mask; and forming a semiconductor structure within underlying layers of the semiconductor topography in alignment with the trimmed device mask.

4. The method of claim 2, wherein the first feature comprises an opening, and wherein the method further comprises forming a trench within underlying layers of the semiconductor topography in alignment with the opening.

5. The method of claim 4, wherein the forming the trench comprises:

tapering a first layer of the underlying layers to expose a second layer of the underlying layers; and removing the exposed portion of the second layer.

6. The method of claim 2, further comprising:

depositing one or more additional layers upon the semiconductor topography subsequent to the patterning the upper layer; and patterning the one or more additional layers using the photolithography process to form a second feature having a dimension substantially equal to or greater than the minimum dimension.

7. The method of claim 6, wherein the second feature comprises an opening arranged above a semiconductor structure, and wherein the method further comprises forming a trench within the semiconductor structure and in alignment with the opening.

8. The method of claim 6, wherein the second feature comprises a device mask arranged adjacent to a trench filled with the one or more additional layers, and wherein the method further comprises forming the device components within underlying semiconductor layers of semiconductor topography in alignment with the device mask.

9. The method of claim 1, wherein the spacing and the first and second device components are arranged along a first dimension parallel to an underlying substrate of the semiconductor topography.

10. A method for processing a semiconductor topography, comprising:

patterning an upper layer of the semiconductor topography using a photolithography process to form device masks having dimensions substantially equal to or greater than a minimum dimension obtainable by the photolithography process;

trimming the device masks;

forming transitional structures within underlying layers of the semiconductor topography in alignment with the trimmed device masks; and patterning the transitional structures.

11. The method of claim 10, wherein the patterning the transitional structures comprises:

tapering a first layer of the transitional structures to expose a second layer of the transitional structures; and removing the exposed portion of the second layer.

12. The method of claim 11, further comprising depositing one or more layers above the transitional structures and adjacent portions of the semiconductor topography prior to the tapering, wherein a thickness of the one or more layers is sufficient to avoid degradation of a substrate arranged adjacent to and underneath the transitional structures during the tapering and the removing.

13. The method of claim 12, wherein the tapering the first layer comprises removing portions of the one or more layers.

14. The method of claim 12, wherein the removing the exposed portion of the second layer comprises removing portions of the one or more layers.

15. The method of claim 12, further comprising etching remaining portions of the one or more layers with an etch chemistry substantially absent of hydrofluoric acid subsequent to the removing the exposed portion of the second layer.

16. The method of claim 11, wherein the tapering the first layer comprises exposing the semiconductor topography to an etch chemistry comprising $CH_3F/O_2$, wherein the ratio of $CH_3F$ to $O_2$ is between approximately 5:1 and approximately 10:1.

17. The method of claim 11, wherein the tapering the first layer comprises setting a temperature of a chuck on which the semiconductor topography is positioned between approximately 0 C. and approximately 10° C.

18. The method of claim 11, wherein the tapering the first layer comprises tapering the first layer to an angle between approximately 60 degrees and approximately 90 degrees relative to the upper surface of the second layer.

19. The method of claim 11, wherein the removing the exposed portion of the second layer comprises tapering the second layer.

20. The method of claim 11, wherein the tapering the second layer comprises exposing the semiconductor topography to an etch chemistry comprising $Cl_2/HBr$, wherein the ratio of HBr to $Cl_2$ is between approximately 5:1 and approximately 10:1.

* * * * *

UNITED STATES PATENT AND TRADEMARK OFFICE
CERTIFICATE OF CORRECTION

PATENT NO. : 6,620,715 B1
DATED : September 16, 2003
INVENTOR(S) : Blosse et al.

It is certified that error appears in the above-identified patent and that said Letters Patent is hereby corrected as shown below:

Column 18,
Line 41, after the word "approximately" please delete "0 C" and substitute therefor -- 0° C --.

Signed and Sealed this

Second Day of December, 2003

JAMES E. ROGAN
*Director of the United States Patent and Trademark Office*